United States Patent
Dahl et al.

(10) Patent No.: US 7,709,339 B2
(45) Date of Patent: May 4, 2010

(54) METHOD FOR PRODUCING A PLANAR SPACER, AN ASSOCIATED BIPOLAR TRANSISTOR AND AN ASSOCIATED BiCMOS CIRCUIT ARRANGEMENT

(75) Inventors: Claus Dahl, Dresden (DE); Armin Tilke, Dresden (DE)

(73) Assignee: Infineon Technologies AG, Munich (DE)

( * ) Notice: Subject to any disclaimer, the term of this patent is extended or adjusted under 35 U.S.C. 154(b) by 224 days.

(21) Appl. No.: 11/553,923

(22) Filed: Oct. 27, 2006

(65) Prior Publication Data

US 2007/0161176 A1   Jul. 12, 2007

Related U.S. Application Data

(63) Continuation of application No. PCT/EP2005/051805, filed on Apr. 22, 2005.

(30) Foreign Application Priority Data

Apr. 30, 2004   (DE) .................. 10 2004 021 241

(51) Int. Cl.
   *H01L 21/331* (2006.01)
(52) U.S. Cl. ..................................... 438/366
(58) Field of Classification Search .............. 438/320, 438/366
   See application file for complete search history.

(56) References Cited

U.S. PATENT DOCUMENTS

| | | | |
|---|---|---|---|
| 5,057,455 A | 10/1991 | Foo et al. | |
| 5,093,272 A | 3/1992 | Hoepfner et al. | |
| 6,096,657 A | 8/2000 | Beckx | |
| 6,465,317 B2 | 10/2002 | Marty | |
| 6,534,371 B2 | 3/2003 | Racanelli | |
| 6,534,372 B1 | 3/2003 | Racanelli | |
| 6,939,770 B1 * | 9/2005 | Khan et al. | 438/301 |
| 2002/0197807 A1 | 12/2002 | Jagannathan et al. | |
| 2004/0014271 A1 | 1/2004 | Cantell et al. | |
| 2004/0072399 A1 | 4/2004 | Cha | |

FOREIGN PATENT DOCUMENTS

DE   10 2004 021 241   1/2005
WO   PCT/US2003/021193   7/2003

OTHER PUBLICATIONS

Chinese Office Action for Patent Application 2005/80021891.8, filed Apr. 22, 2005.

* cited by examiner

*Primary Examiner*—W. David Coleman
(74) *Attorney, Agent, or Firm*—Brinks Hofer Gilson & Lione

(57) ABSTRACT

Method for producing a planar spacer, an associated bipolar transistor and an associated BiCMOS circuit arrangement. The invention relates to a method for production of a planar spacer, of an associated bipolar transistor and of an associated BiCMOS circuit arrangement, in which first and second spacer layers are formed after the formation of a sacrificial mask on a mount substrate. A first anisotropic etching process of the second spacer layer is carried out to produce auxiliary spacers. A second anisotropic etching step is then carried out, in order to produce the planar spacers, using the auxiliary spacers as an etch mask.

20 Claims, 8 Drawing Sheets

METHOD FOR PRODUCING A PLANAR SPACER, AN ASSOCIATED BIPOLAR TRANSISTOR AND AN ASSOCIATED BICMOS CIRCUIT ARRANGEMENT

RELATED APPLICATIONS

This application is a continuation of PCT Application Serial No. PCT/EP2005/051805, filed Apr. 22, 2005, designating the United States and published in English, which claims priority to German patent application Ser. No. 10/2004/021/241.1, filed Apr. 30, 2004, both of which are hereby incorporated by reference in their entirety.

TECHNICAL FIELD

The present invention relates to a method for production of a planar spacer, to an associated bipolar transistor and to an associated BiCMOS circuit arrangement, and in particular to a method for production of self-adjusting single-poly bipolar transistors with improved electrical characteristics in a BiCMOS circuit.

BACKGROUND

In bipolar transistors, it is necessary to make contact with and to connect to the region of the intrinsic base with as low an impedance as possible in order to achieve very high cut-off frequencies and to reduce the RF noise. This is achieved particularly advantageously by a base connection which is as short as possible, is preferably self-adjusting, and thus has a low impedance.

In the case of so-called "single-poly bipolar technologies", this base connection region is normally defined lithographically, that is to say not in a self-adjusting manner. By way of example, the lithographically defined emitter plug is used as an implantation hard mask for the base contact. Since the doping of the intrinsic base defines the current gain of the bipolar transistor, it cannot be chosen to be indefinitely high. If the base connection and/or the base connection region which directly touches the intrinsic base are/is not formed by a dedicated, heavily-doped polysilicon layer, which allows contact to be made with the intrinsic base in a self-adjusting manner, the base connection is normally heavily doped by ion implantation by means of, for example, a photoresist mask. In this case, the minimum distance between the heavily doped component of the base connection and the active transistor area, that is to say the intrinsic base, is governed by the lithography tolerances. For this reason, the base connection in "single-poly bipolar transistors" such as these has a relatively high impedance, since the heavily doped connection region is connected to the intrinsic base through this relatively long region, which is doped only with the low dopant concentration of the intrinsic base.

Conventional bipolar transistors thus often use two polysilicon layers to provide a contact, with one being intended for the emitter contact, and one for the base contact. In this case, an emitter window, which defines an actual contact area between the emitter and the intrinsic base, is etched by the heavily doped base connection polysilicon. The base connection is thus automatically located in a self-adjusting manner alongside the emitter window, in which the intrinsic base is defined. In this variant, the low-impedance base connection is obtained by outward diffusion from the base connection polysilicon to the intrinsic base.

In a conventional single-poly bipolar transistor dedicated polysilicon deposition or a dedicated polysilicon layer is used only for the emitter contact, the base connection region is normally defined lithographically, and is heavily doped by means of implantations. Since this process is in consequence not self-adjusting, it thus includes all of the lithography fluctuations and tolerances.

SUMMARY

According to an aspect of the invention, planar spacers are produced using the auxiliary spacers after a first anisotropic etching step has been carried out in order to produce auxiliary spacers from the second spacer layer on the side walls of the first spacer layer, and after a second anisotropic etching step from the first spacer layer, in particular by the formation of a sacrificial mask on a mount substrate, the subsequent formation of a first spacer layer and the final formation of a second spacer layer, by means of which planar spacers a large number of self-adjusting processes can be carried out in a very simple manner, thus resulting in components and, in particular, bipolar transistors with improved electrical characteristics.

The planar spacer preferably has an essentially constant layer thickness, with its width being defined by the sum of the layer thicknesses of the first and second spacer layers.

The auxiliary spacer and the sacrificial mask are preferably composed of an identical material, so that the sacrificial mask can also be removed at the same time with the removal of the auxiliary spacers, and the emitter windows as described in the introduction for bipolar transistors can in consequence be produced very easily.

With regard to the method for production of a bipolar transistor having planar spacers as described above, only one base semiconductor layer need in consequence be formed as a base layer on a semiconductor substrate, which acts as a collector layer, in order to produce the mount material, in which case, after the formation of the sacrificial mask, base connection implantation is carried out in order to form low-impedance base connection regions and with the intrinsic base in the base layer being masked, and, once the sacrificial mask has been reduced, an emitter semiconductor layer, which is used as an emitter layer, is formed and structured on the surface of the mount substrate and of the planar spacers. This allows an optimum base connection for, for example, a reasonably p-doped intrinsic base to be produced by a self-adjusting process (the inner base is normally doped to about 1E18 to 1E19, with the extrinsic base being about 1E20 or more). The inner base is preferably doped such that, on the one hand, the current gain is sufficiently high and the diode leakage currents are sufficiently small, with this being ensured by low base doping. On the other hand, the inner base should also have a sufficiently low impedance in order, in particular, that RF noise is low.

Furthermore, all of the statements here apply not only to an npn transistor, that is to say to a p-doped base, but in principle also to a pnp transistor, in which case the base would then be n-doped.

Furthermore, the base may in this case be formed either by implantation or epitaxy.

In consequence, at least a part of the sacrificial mask defines an emitter window area for definition of a contact area of the emitter layer with the intrinsic base, in which outer spacers can be formed on the side walls of the sacrificial mask and/or inner spacers can be formed on the side walls of the planar spacers in order to define a predetermined distance between the low-impedance base connection region and the intrinsic base in the emitter window area. This makes it possible to ensure that the base contact implantation enters only areas of the base layer of low quality, for example a polycrystalline structure, while the effective emitter window is always located on or above monocrystalline material of the base layer and/or of the reasonably doped base semiconductor layer.

The base semiconductor layer is thus preferably grown epitaxially at least in the emitter window area as a monocrystalline compound semiconductor layer and, in particular, a SiGe or SiGe:C semiconductor layer.

With regard to the method for production of a BiCMOS circuit arrangement, at least a partially complete field-effect transistor structure is first of all formed in a field-effect transistor area in a semiconductor substrate and is passivated with a thin passivation layer, with the process as described above for production of a bipolar transistor having planar spacers then being carried out after removal or opening of the passivation layer in at least one bipolar transistor area of the semiconductor substrate. Particularly in the case of a BiCMOS circuit arrangement such as this, this results in particular advantages from the planar spacers in that the major topographical differences which normally occur in the field-effect transistor area do not cause any problems at all in the production of the bipolar transistor in the bipolar transistor area of the semiconductor substrate. In consequence, BiCMOS circuits can for the first time be produced with improved electrical characteristics and reduced production costs.

After the removal of the passivation layer, subcollector implantation can preferably then be carried out within the bipolar transistor area in order to form a buried subcollector in the semiconductor substrate, thus allowing the electrical characteristics to be improved further, without any additional costs. Particularly in the case of BiCMOS circuits with radio-frequency and/or high-voltage bipolar transistors, buried subcollectors such as these can thus be produced easily and cost-effectively using already existing lithography levels.

DETAILED DESCRIPTION

The following description of the figures explains the concept according to the invention for production of a planar spacer, as can be used in particular in a bipolar transistor and an associated BiCMOS circuit arrangement.

In particular, the use of a sacrificial mask as an implantation hard mask and as a foundation allows planar spacers to be formed in a self-adjusting manner for connection regions as close as possible to an area which will be exposed later, for example an intrinsic base of a single-poly bipolar transistor.

First of all, a method according to the invention for production of a planar spacer and, in particular, of a planar outer spacer, will be described with reference to FIGS. 1A to 1F. In the following text, the expression "planar outer spacer" means a flat essentially planar spacer which is formed on the outer walls of a mask plug.

Figure 1A:
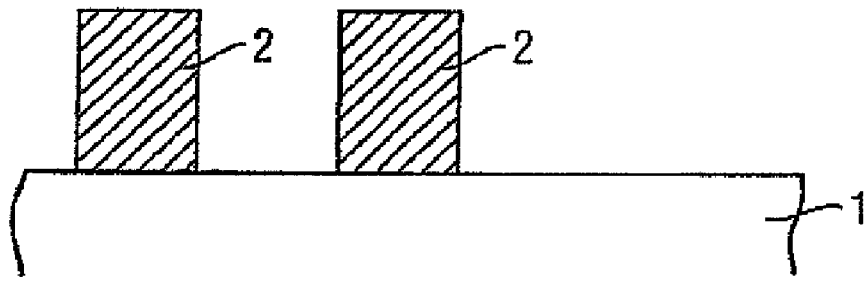
FIGS. 1A to 1F show simplified section views in order to illustrate a method for production of a planar spacer in accordance with an aspect of the invention.

As shown in FIG. 1A, a sacrificial mask 2 is first of all formed on a mount substrate 1, for example with an Si3N4 layer being deposited over the entire area and then being structured photolithographically by means of conventional methods, that is to say with etching being carried out using a photoresist which is not illustrated. This results in the sacrificial mask 2, as illustrated in FIG. 1A, with, by way of example, two nitride plugs which are a short distance apart from one another, or, for example, may be a long distance apart from one another on the right-hand side.

Figure 1B:
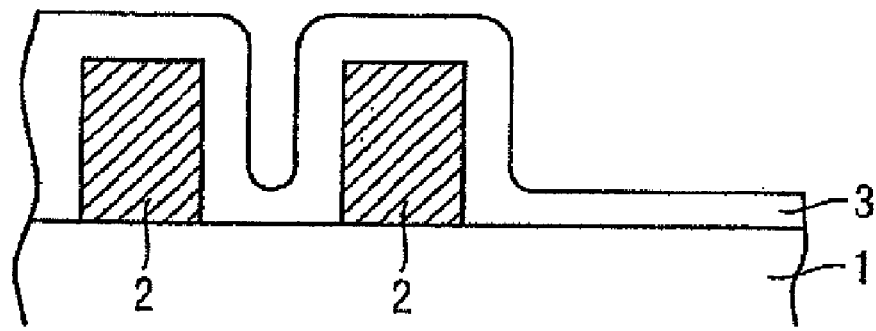

As shown in FIG. 1B, once this sacrificial mask 2 has been formed, a first spacer layer 3 is first of all formed on the surface of the mount substrate 1 and of the sacrificial mask 2. By way of example, a SiO2 layer is in this case deposited conformally as the first spacer layer 3. The thickness of this first spacer layer 3 should in this case be sufficiently small that the intermediate spaces are not filled completely even in the area of the short separation in the sacrificial mask.

Figure 1C:
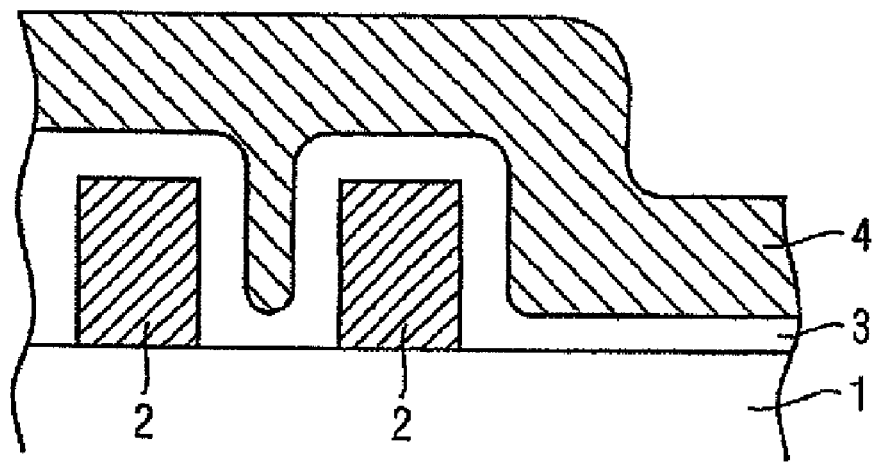

As shown in FIG. 1C, a second spacer layer 4 is then formed on the surface of the first spacer layer 3. By way of example, the second spacer layer 4 is once again deposited and, preferably, comprises an Si3N4 layer. The thickness of the second spacer layer 4 is preferably greater than the thickness of the first spacer layer 3, with the area with the short distance between the sacrificial mask 2 being completely closed in the process, whilst an area on the right-hand side illustrated in FIG. 1C with a long distance between respective subareas of the sacrificial mask 2 is also not completely filled.

Figure 1D:
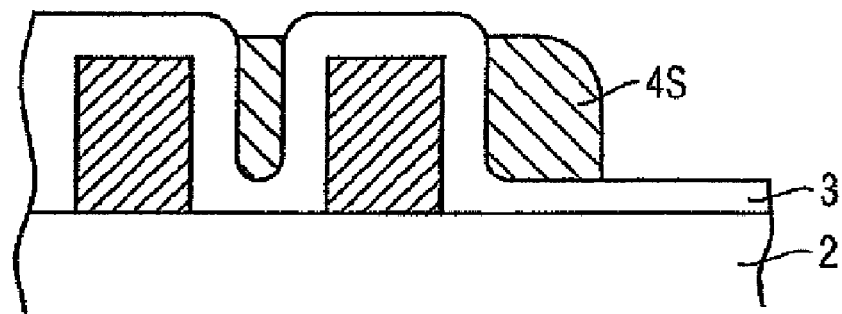

As shown in FIG. 1D, a first anisotropic etching step is now carried out in order to produce auxiliary spacers 4S from the second spacer layer 4 on the side walls of the first spacer layer 3. To be more precise, the second spacer layer 4 is in this case removed using a conventional spacer etching process such as a dry etching process (RIE, Reactive Ion Etch) until only the auxiliary spacers 4S illustrated in FIG. 1D remain. In this case, the first spacer layer 3 is preferably used for end-point identification. To be more precise, in consequence, the anisotropic first etching step is ended when constituents of the first spacer layer 3 can be detected in the reaction gas.

Figure 1E:
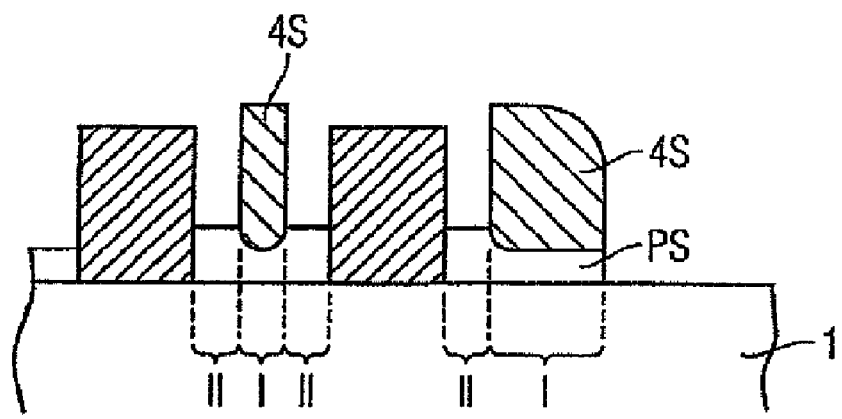

As shown in FIG. 1E, a second anisotropic etching step is then carried out in order to produce the actual planar spacer PS from the first spacer layer 3, using the auxiliary spacers 4S, once again with a dry etching process being applied to the first spacer layer 3, for example such as reactive ion etching. The end point for this second anisotropic etching step is in this case preferably defined by a predetermined time period during which those areas I of the planar spacer PS which are covered by the auxiliary spacer 4S essentially have the same layer thickness as the uncovered, and thus etched, areas II of the planar spacer PS.

Figure 1F:
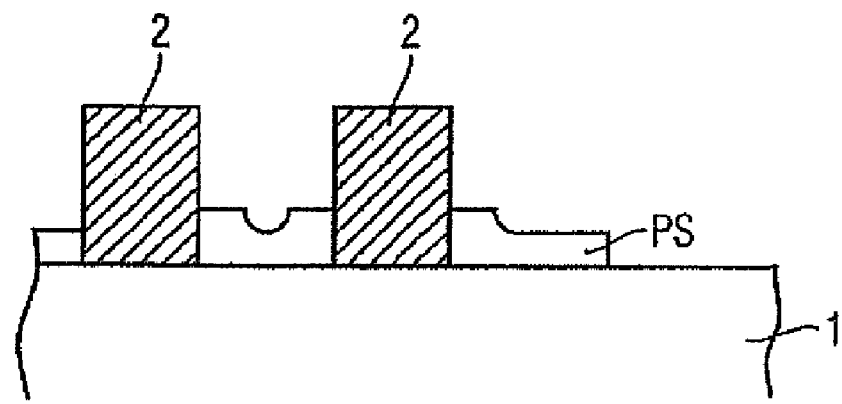

After removal of the auxiliary spacers 4S, this results in the section view illustrated in FIG. 1F, in which an essentially planar spacer PS is thus formed on the side walls of the sacrificial mask 2, only in its lower area. The width of the planar spacer essentially comprises the sum of the layer thicknesses of the first and second spacer layers 3 and 4 (provided that there is sufficient distance between the sacrificial plugs), with its height corresponding essentially to the layer thickness of the first spacer layer 3.

Planar spacers PS such as these offer a large number of novel isolation, contact and implantation capabilities which allow components with improved electrical characteristics, as will be described in detail in the following text with reference to FIGS. 2A to 2F.

FIGS. 2A to 2F show simplified section views in order to illustrate a method for production of a bipolar transistor having planar spacers, in which identical reference symbols represent identical or corresponding elements or layers to those in FIG. 1, for which reason they will not be described again.

Figure 2A:
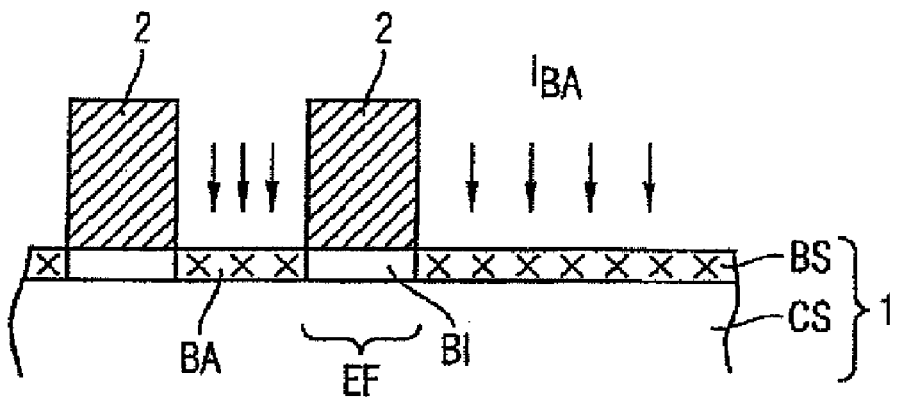
FIGS. 2A to 2F show simplified section views in order to illustrate a method for production of a bipolar transistor having planar spacers in accordance with an aspect of the invention.
Figure 2B:
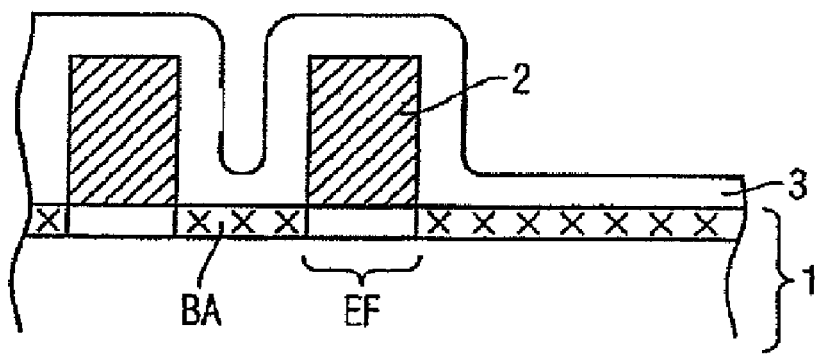
Figure 2C:
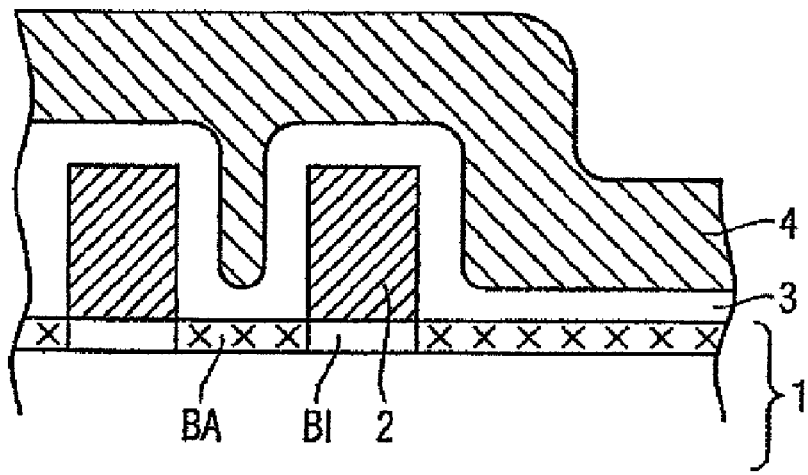
Figure 2D:
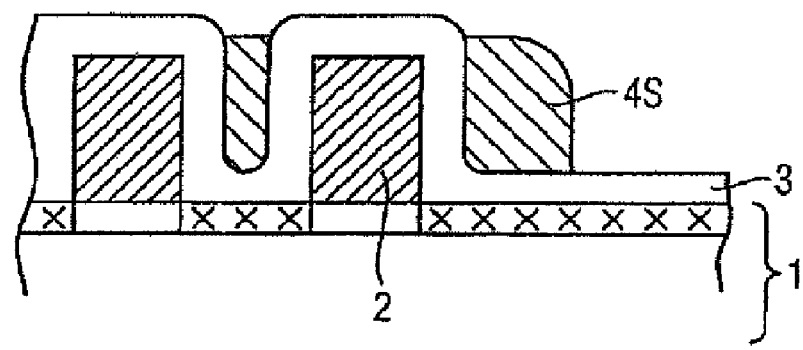
Figure 2E:
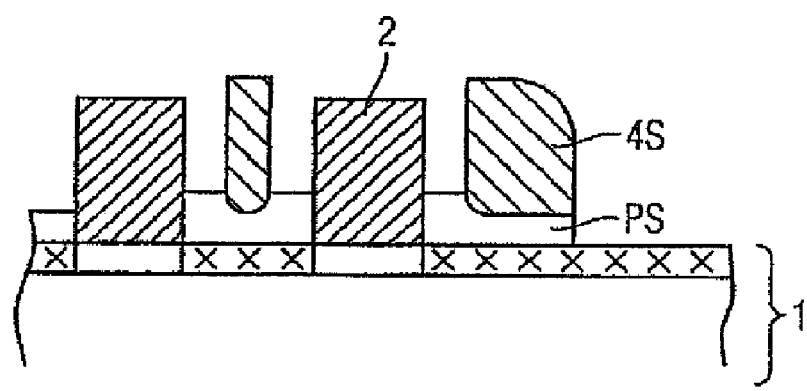

As shown in FIG. 2A, the mount substrate 1 comprises a semiconductor substrate which acts as a collector layer CS and is, for example, n-doped, and a base semiconductor layer 5 which is formed on it is, for example, reasonably or lightly p-doped, and acts as a later base layer BS, For the semiconductor substrate or the collector layer CS, an n-doped silicon substrate is preferably grown on the surface of the semiconductor substrate CS, and an epitaxially grown monocrystalline p-doped silicon layer is preferably grown on the surface of the semiconductor substrate CS for the base layer BS, which forms a base of the bipolar transistor, or an implanted area of the silicon substrate is used for this purpose.

Once the sacrificial mask 2 has been formed on the surface of the base layer BS, a base connection implantation process IBA is carried out, as shown in FIG. 2A, in order to form low-impedance base connection regions BA at the side alongside the sacrificial mask and/or the plugs of the sacrificial mask 2. An intrinsic base BI, whose impedance is higher, is masked during the implantation process at the same time in an emitter window area EF by the protection of the sacrificial mask 2 (the intrinsic base has preferably been formed even before the spacer process). Because of the lack of implantation in this area, the intrinsic base essentially has the same doping as the originally grown epitaxial base layer, with its lightly p-doped base semiconductor layer.

As shown in FIGS. 2B to 2E, the same steps are now carried out as in FIGS. 1B to 1E, as a result of which the planar spacers PS are formed in their lower area on the side walls of the sacrificial mask 2. Provided that the auxiliary spacers 4S and the sacrificial mask 2 are composed of the same material) such as Si3N4, they can be removed at the same time subsequently in one process by a nitride strip.

Figure 2F:
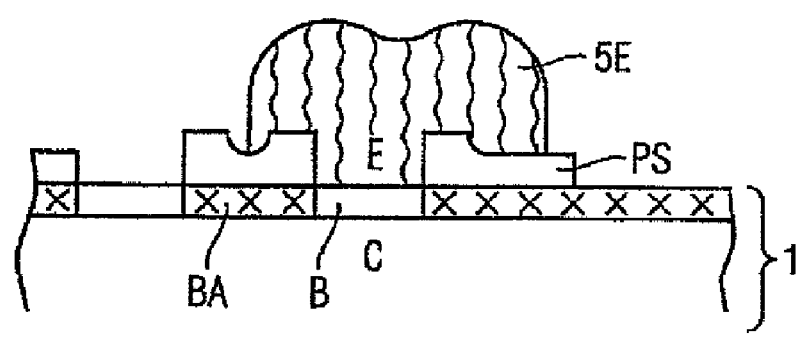

As shown in FIG. 2F, once the sacrificial mask 2 and the auxiliary spacer 4S have been removed, an emitter semiconductor layer 5 is formed on the surface of the semiconductor wafer or of the mount substrate 1, and thus on the surface of the planar spacers BS and of the intrinsic base BI in such a manner that this results in the structured emitter layer 5E illustrated in FIG. 2F. In this case, in-situ-doped polysilicon is preferably deposited over the entire area as an emitter semiconductor layer 5, and is then structured photolithographically so that the emitter layer 5E touches and makes contact with the intrinsic base BI only in the emitter window area EF, and is otherwise isolated from the essentially planar spacers PS by the mount substrate 1.

The second (or right-hand and heavily doped) exposed area of the mount substrate 1 illustrated in FIG. 2F is in this case used as a contact area for the base connection regions BA, which are now aligned self-adjusted exactly to the intrinsic base BI of the bipolar transistor.

This results in particularly high cut-off frequencies, in which case, in particular, it is possible to reduce RF noise. Since, furthermore, the height of the planar spacers can be set to be very low, the connection resistances for the emitter E of the bipolar transistor are also extremely low. In consequence, this results in a single-poly bipolar transistor with excellent electrical characteristics in a particularly simple and cost-effective manner.

Furthermore, a bipolar transistor such as this is particularly suitable to be integrated in a so-called BiCMOS circuit arrangement.

FIGS. 3A to 3J show simplified section views in order to illustrate a method for production of a BiCMOS circuit arrangement, in which a bipolar transistor having planar spacers according to the invention is integrated in a circuit with field-effect transistors and, in particular, a CMOS circuit. Identical reference symbols in this case denote identical or corresponding elements or layers as in FIGS. 1 and 2, for which reason they will not be described again in the following text.

Figure 3A:
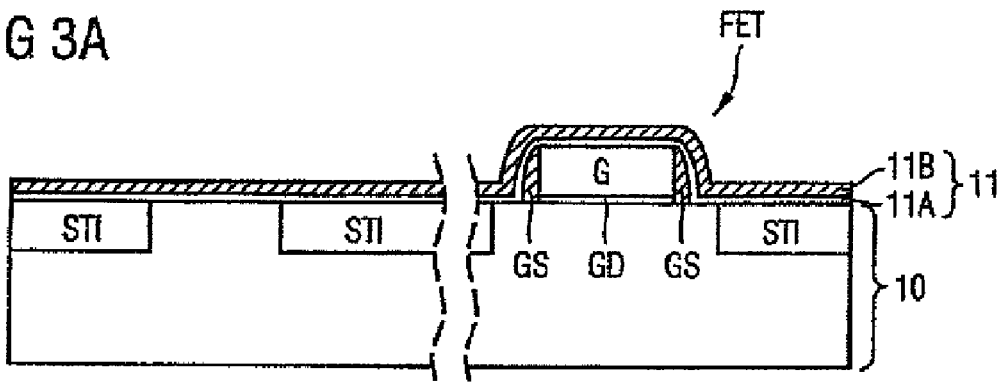
FIGS. 3A to 3J show simplified section views in order to illustrate a method for production of a BiCMOS circuit arrangement having planar spacers according to an aspect of the invention.

FIG. 3A shows a simplified section view of a BiCMOS circuit arrangement as is used, for example, for integration of bipolar transistors in CMOS circuits. A semiconductor substrate 10 which preferably represents a silicon semiconductor substrate in this case has so-called flat trench isolations STI (Shallow Trench Isolation) as isolating trenches for definition of active regions within the semiconductor substrate 10, which, for example, represents a semiconductor wafer. In this case, a field-effect transistor FET is at least partially completed within a field-effect transistor area of the monocrystalline semiconductor substrate 10, with its control electrode and its gate G, its gate dielectric GD as well as its optionally provided gate spacers GS (normally, the source/drain regions are implanted and annealed only later, in order that they are not subjected to the thermal budget of the bipolar transistor process; that is to say, at this point in the process, the gate is made with spacers, but the source/drain have not yet been implanted). CMOS field-effect transistors such as these will not be described in detail at this point since they are generally known to those skilled in the art.

In order to provide isolation and passivation, a thin passivation layer 11 is then preferably formed over the entire area of the surface of the semiconductor substrate 10, that is to say also on the surface in the bipolar transistor area. This dielectric passivation layer is composed, for example, of an SiO2 layer 11A, which is formed directly on the mount substrate 10, and/or on its isolation trenches STI or on the gate stacks. Furthermore, a Si3N4 layer 11B can be deposited on the surface of the passivation layer element 11A, with the two layers essentially being used to protect the field-effect transistor area.

Figure 3B:
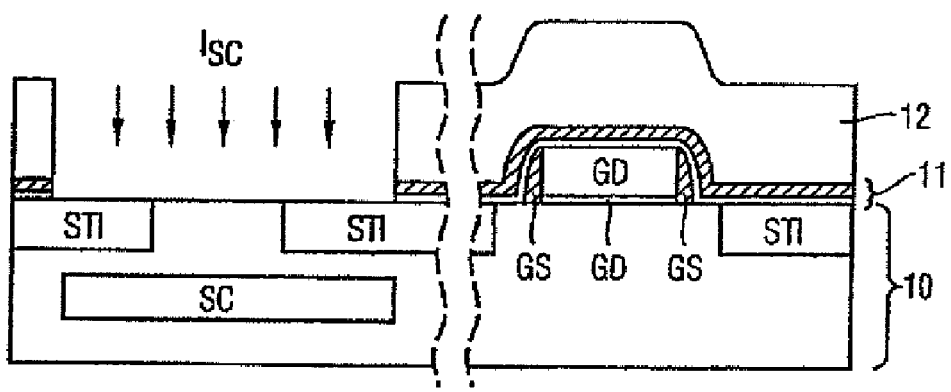

As shown in FIG. 3B, a mask layer 12 is applied in a subsequent step over the entire area on the wafer or the mount substrate 10, and is structured in order to expose the bipolar transistor area. By way of example, a photoresist is centrifuged on over the entire area and is photolithographically structured, as a result of which the passivation layer 11 can be removed in a bipolar transistor area using the mask and/or the photoresist 12. By way of example, the nitride/oxide stack of the passivation layer 11 can in this case be subjected to wet or dry etching. Furthermore, any gate-dielectric layer (not illustrated) which may still be present can also be removed at this point, normally representing a so-called gate oxide.

After the removal of the passivation layer 11 in the bipolar transistor area, the subcollector implantation process ISC as illustrated in FIG. 3B can optionally be carried out in the semiconductor substrate 10, using the photoresist 12 in order to form a buried subcollector SC. By way of example, in this case, a high-energy implantation process is carried out for the subcollector SC and a buried layer which corresponds to this region.

Figure 3C:
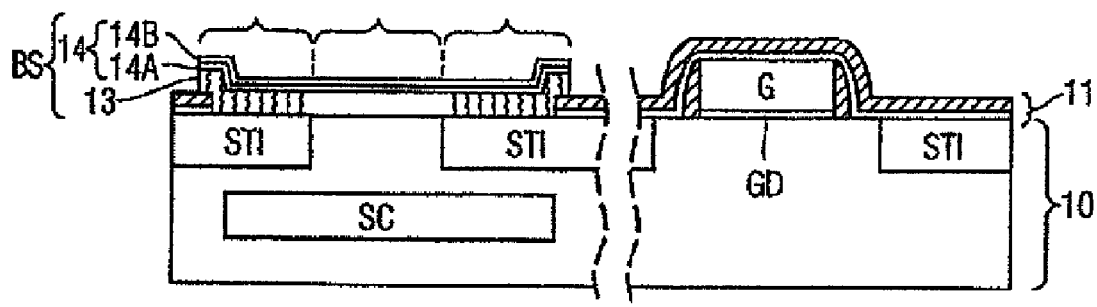

As shown in FIG. 3C, the bipolar transistor is then formed, in accordance with the method steps as described above, as shown in FIG. 2.

At this point, a non-selective base epitaxy process for epitaxial growth of a base semiconductor layer 13 (which is, for example, lightly p-doped) is preferably carried out in the bipolar area on the semiconductor substrate 10, in which essentially polycrystalline semiconductor material is epitaxially grown on the surface of the oxide-filled isolation trench STI, while monocrystalline semiconductor material is grown as a base semiconductor layer 13 (which is, for example, p-doped) on the surface of the monocrystalline semiconductor substrate 10. By way of example, during this epitaxial growth, a compound semiconductor and, in particular, SiGe or SiGe:C can be formed as the base semiconductor layer 13. Furthermore, a dielectric covering layer 14 can be formed on the surface of this base semiconductor layer 13 and is composed, for example, of an oxide layer 14A which is formed directly on the surface of the base semiconductor layer 13 (which is, for example, p-doped), and a nitride layer 14B, which is formed on the surface of the oxide layer 14A, and which jointly represent the base BS.

In a further lithography step which is not illustrated, this base layer BS which comprises the layers 13 and 14 is now structured, for example, photolithographically in the bipolar transistor area or is removed in the other areas of the semiconductor wafer, such as the field-effect transistor area, thus resulting in the section view illustrated in FIG. 3C.

Figure 3D:
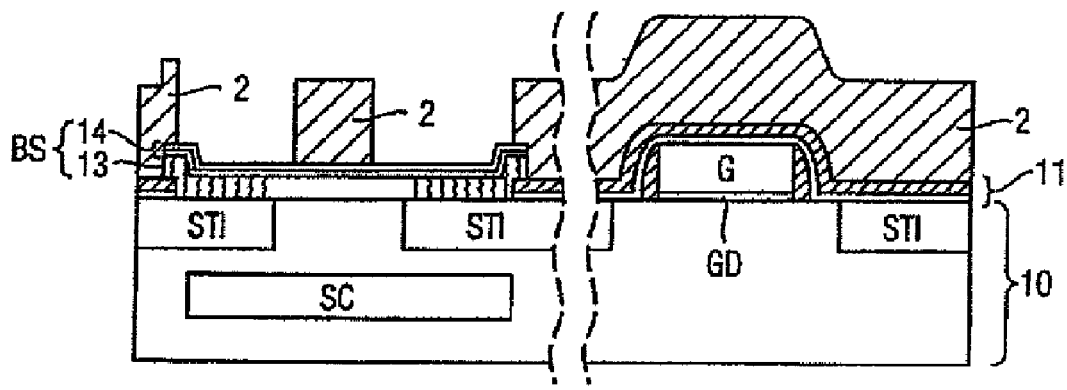

As shown in FIG. 3D, the sacrificial mask 2 is now formed, with the plug of the sacrificial mask 2 which defines the emitter window area preferably coming to rest above the monocrystalline area of the base semiconductor layer 13. In this case, a relatively thick nitride layer is preferably once again used in conjunction with a base contact lithographical process in order to structure the nitride sacrificial mask 2.

Figure 3E:
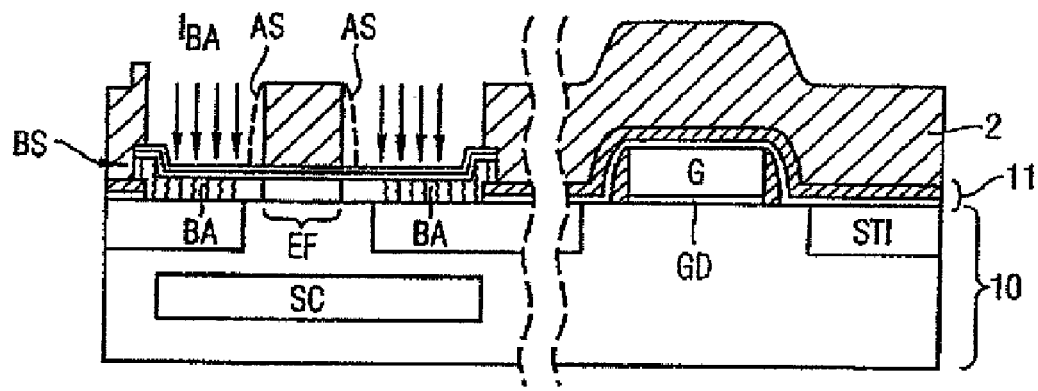

As shown in FIG. 3E, the base connection implantation step IBA is now carried out in order to form low-impedance base connection regions BA, mainly in the polycrystalline area of the base semiconductor layer 13.

In order to define a predetermined distance between the low-impedance base connection regions BA within the base semiconductor layer 13 (which is, for example, p-doped) and the intrinsic base BI, which is covered by the sacrificial mask 2, in the emitter window area EF, outer spacers AS can optionally be formed in the conventional manner on the side walls of the sacrificial mask, or on the plug 2 for the emitter window EF. Outer spacers such as these thus restrict the implantation area of the base connection implantation IBA. This makes it possible, for example, to ensure that the base connection implantation IBA enters only the polycrystalline areas of the base semiconductor layer 3. The effective emitter window EF in the area underneath the sacrificial plug 2 is thus always located on a monocrystalline region, thus making it possible to reliably prevent the lateral migration of displacements into the area of the active inner base BI.

Figure 3F:
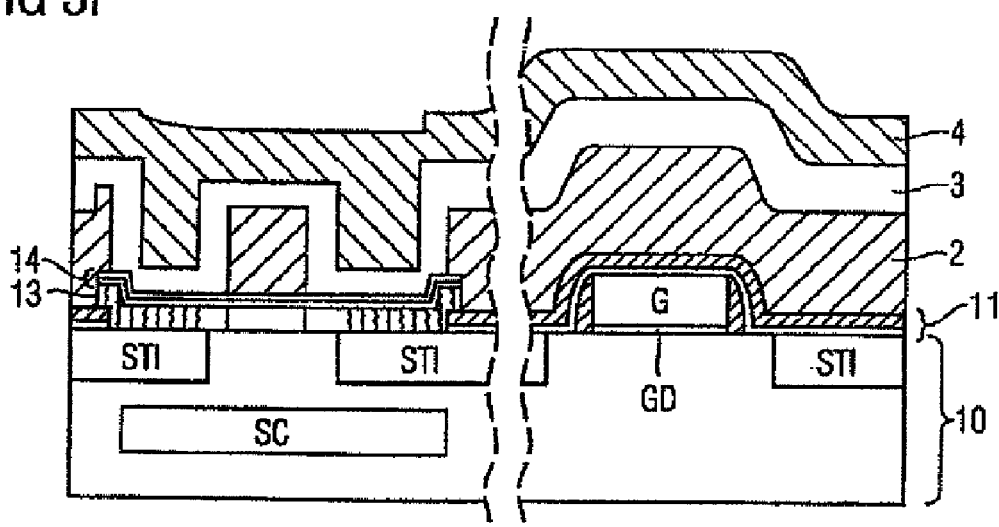

As shown in FIG. 3F, the first spacer layer 3 (which, by way of example, is composed of an oxide layer) and the second spacer layer 4 (which, for example, is composed of a nitride layer) are then deposited over the entire area on the surface of the semiconductor wafer or of the semiconductor substrate 10.

Figure 3G:
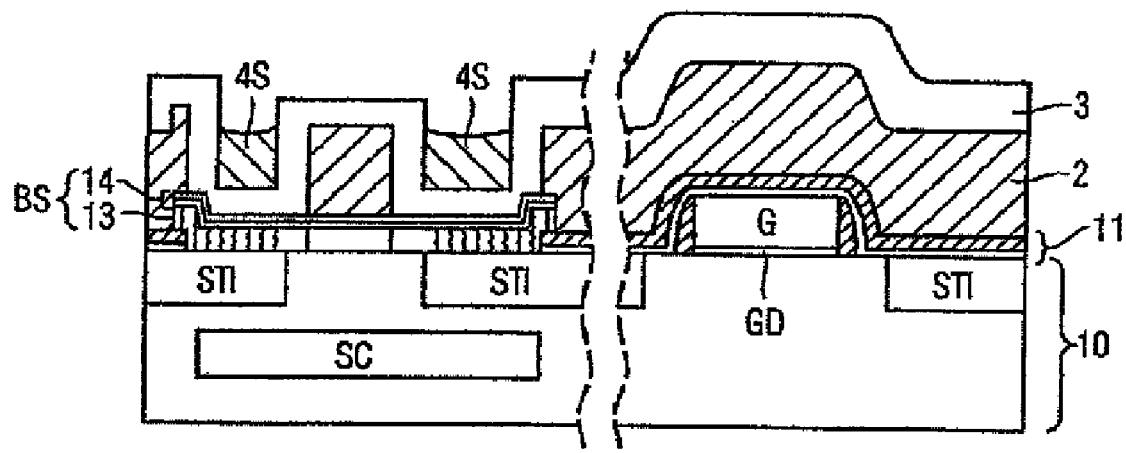

When a first anisotropic, that is to say directional, etching process is carried out using end-point identification on the first spacer layer 3, the second spacer layer 4 is etched back in such a manner that the auxiliary spacers 4S are formed on the side walls of the first spacer layer 3 as shown in FIG. 3G. In this case, a dry etching process and, in particular, an RIE process are preferably once again used, during which process overetching can also be carried out in addition to exact end-point identification.

Figure 3H:
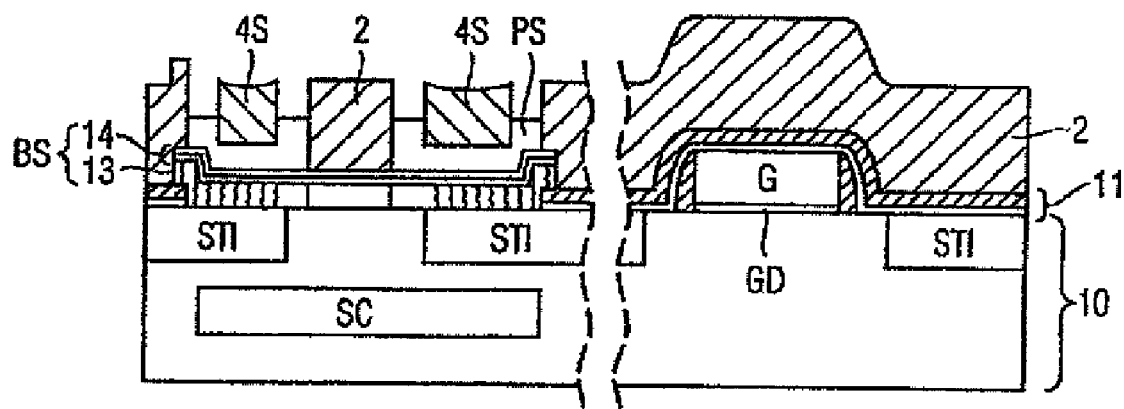

As shown in FIG. 3H and as has been described above, a second anisotropic etching process, and in particular a dry etching process, is carried out on the oxide layer and/or on the first spacer layer 3 until the approximately planar spacer PS is formed. To be more precise, the first spacer layer 3 is etched back directly in this case as a function of an empirically determined time period, until those areas of the planar spacer which are covered by the auxiliary spacer 4S essentially have the same layer thickness as the exposed areas of the planar spacer PS.

Figure 3I:
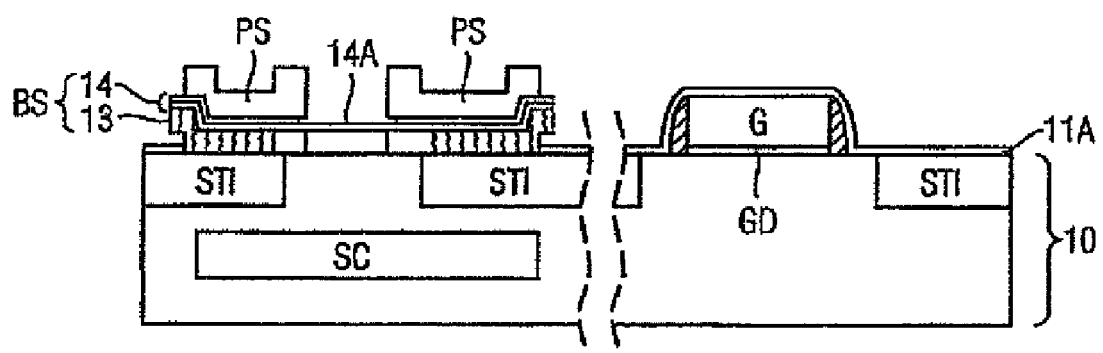

As shown in FIG. 3I, the auxiliary spacers 4S, the sacrificial mask 2 and the nitride layer 14B on the dielectric covering layer 14 as well as the nitride layer 11B on the passivation layer 11 are then removed. Since these layers are preferably all composed of the same material, they can advantageously be removed at the same time in one method step, or one nitride strip.

Figure 3J:
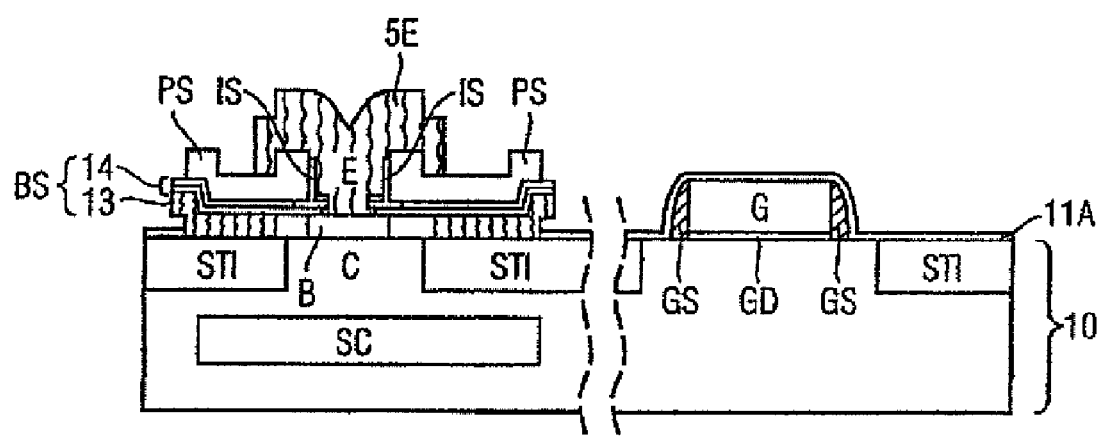

As shown in FIG. 3J, an inner spacer IS can now optionally once again be formed on the side walls of the planar spacers PS by means of conventional spacer technology in order to define a predetermined distance between the low-impedance base connection regions BA and the intrinsic base BI within the emitter window area EF, in which case lateral migration of displacements into the area of the active inner base can once again be reliably prevented in the same manner as that with the outer spacers AS. Furthermore, the distance between the heavily doped and lightly doped area of the base semiconductor layer 13 can likewise be set in a defined manner in this way. By way of example, this inner spacer IS may be L-shaped, thus allowing the actually effective emitter window area to be reduced further in a defined manner.

A further etching step is then carried out in order to remove the oxide layer 14A in the emitter window area, in which case, by way of example, a wet etching process can be used. In this case, the thicker oxide layer 11A on the passivation layer 11 is thinned at the same time, but is not removed completely. Finally, the in-situ-doped polysilicon is deposited as the emitter layer 5, with structuring by means of conventional photolithographic methods and an etch stop on the exposed oxide being carried out in order to form the illustrated emitter area 5E.

This results in a BiCMOS circuit arrangement whose bipolar transistor has excellent electrical characteristics and, furthermore, can be produced cost-effectively.

The invention has been described above with reference to a BiCMOS circuit arrangement as well as an npn bipolar transistor having planar spacers. However, it is not restricted to this and in the same way covers further semiconductor components and, in particular, pnp transistors in which an essentially planar outer spacer is used. The major advantage in this case is that, in contrast to the situation with conventional spacers, the height of the planar spacer can be set freely, and essentially depends only on the deposition thickness of the first spacer layer. Furthermore, the planarity or flat surface of the essentially planar spacer simplifies the rest of the process.

Thus, it is apparent there has been described in accordance with the invention a method for producing a planar spacer, an associated bipolar transistor and an associated bicmos circuit arrangement that fully provides the features set forth above. Those skilled in the art will recognize that variations and modifications can be made without departing from the spirit and scope of the invention. Accordingly, all such variations and modifications are included within the scope of the appended claims and equivalents thereof.

We claim:

1. A method for producing a planar spacer comprising:
   a) forming a sacrificial mask on a semiconductor substrate
   b) forming a first spacer layer on the surface of the substrate and on the sacrificial mask;
   c) forming a second spacer layer on the first spacer layer;
   d) carrying out a first anisotropic etching step of the second spacer layer to form auxiliary spacers on the side walls of the first spacer layer;

e) carrying out a second anisotropic etching step of the first spacer layer to produce the planar spacer using the auxiliary spacers as an etching mask, wherein the first and second anisotropic etching steps are carried out in the absence of an etch mask on regions of the second spacer layer overlying the auxiliary spacers; and f) removing the auxiliary spacer and the sacrificial mask, wherein the auxiliary spacer and the sacrificial mask comprise the same material, and wherein the sacrificial mask and the auxiliary spacers are removed at substantially the same time.

2. The method of claim 1, wherein the second anisotropic etching step is carried out such that areas of the planar spacer covered by the auxiliary spacer have substantially the same layer thickness as uncovered areas of the planar spacer.

3. The method of claim 1, wherein one end point of the second anisotropic etching step is defined by a predetermined time period.

4. The method of claim 1, wherein the sacrificial mask and the second spacer layer comprise $Si_3N_4$, and the first spacer layer comprises $SiO_2$.

5. A method for producing a bipolar transistor having planar spacers, the method comprising:

epitaxially forming a base semiconductor layer on the semiconductor substrate, wherein the semiconductor substrate functions as a collector;

forming a dielectric covering layer on the surface of the base semiconductor layer;

forming a sacrificial mask on the covering layer;

carrying out a base connection implantation to form low-impedance base connection regions and an intrinsic base, which has a higher impedance than the base connection regions in the base semiconductor layer;

forming a first spacer layer on the surface of the substrate and on the sacrificial mask;

forming a second spacer layer on the first spacer layer;

carrying out a first anisotropic etching step of the second spacer layer to form auxiliary spacers on the side walls of the first spacer layer;

carrying out a second anisotropic etching step of the first spacer layer to produce the planar spacer using the auxiliary spacers as an etching mask, wherein the first and second anisotropic etching steps are carried out in the absence of an etch mask on regions of the second spacer layer overlying the auxiliary spacers; and removing the auxiliary spacer and the sacrificial mask; and forming an emitter semiconductor layer on the surface of the semiconductor substrate and on the planar spacer.

6. The method of claim 5, wherein at least a part of the sacrificial mask defines an emitter window area in which the emitter layer contacts the intrinsic base.

7. The method of claim 5, wherein forming the base semiconductor layer comprises forming a compound semiconductor.

8. The method of claim 5, wherein forming the dielectric covering layer comprises forming an $SiO_2$ layer on the surface of the base semiconductor layer, and forming an $Si_3N_4$ layer overlying the $SiO_2$ layer.

9. The method of claim 5, wherein the emitter semiconductor layer comprises an in-situ-doped or implanted polycrystalline semiconductor layer.

10. The method of claim 6, further comprising one of forming outer spacers on the side walls of the sacrificial mask or forming inner spacers on the side walls of the planar spacers to define a predetermined distance between the low-impedance base connection regions and the intrinsic base in the emitter window area.

11. The method of claim 6, wherein forming the base semiconductor layer comprises epitaxially growing a monocrystalline semiconductor layer on at least the emitter window area.

12. The method of claim 6, wherein forming the base semiconductor layer comprises forming a monocrystalline semiconductor layer at least in the emitter window area by means of implantation in the silicon substrate.

13. The method of claim 6 further comprising forming outer spacers on the side walls of the sacrificial mask and forming inner spacers on the side walls of the planar spacers to define a predetermined distance between the low-impedance base connection regions and the intrinsic base in the emitter window areas.

14. The method of claim 7, wherein the compound semiconductor comprises SiGe or SiGe:C.

15. The method of claim 9, wherein the polycrystalline semiconductor layer comprises polysilicon.

16. A method for production of a BiCMOS circuit comprising:

preparing a semiconductor substrate;

forming an at least partially complete field-effect transistor in a field-effect transistor area of the semiconductor substrate;

forming a passivation layer on the surface of the semiconductor substrate and over the field-effect transistor structures;

removing a portion of the passivation layer in order to expose the semiconductor substrate in at least one bipolar transistor area; and forming a bipolar transistor with planar spacers as recited in claim 5 on the bipolar transistor area of the semiconductor substrate.

17. The method of claim 16, wherein preparing the semiconductor substrate comprises forming isolation trenches to define active areas in a monocrystalline semiconductor substrate having areas of polycrystalline semiconductor material and, apart from this, an area of monocrystalline semiconductor material formed on the surface of the isolation trenches during the formation of the base semiconductor layer.

18. The method of claim 16, further comprising, after the removal of the passivation layer, implanting ions into the bipolar transistor area to form a buried subcollector in the semiconductor substrate.

19. A method for production of a BiCMOS circuit, the method comprising:

preparing a semiconductor substrate;

forming an at least partially complete field-effect transistor in a field-effect transistor area of the semiconductor substrate;

forming a passivation layer on the surface of the semiconductor substrate and over the field-effect transistor structures;

removing a portion of the passivation layer in order to expose the semiconductor substrate in at least one bipolar transistor area;

forming a bipolar transistor with planar spacers on the bipolar transistor area of the semiconductor substrate, wherein forming the bipolar transistor comprises:

forming a base layer that includes a base semiconductor layer on the semiconductor substrate, wherein the semiconductor substrate functions as a collector;

forming a dielectric covering layer on the surface of the base semiconductor layer during the formation of the base layer, forming a sacrificial mask on the covering layer;

carrying out a base connection implantation to form low-impedance base connection regions and an intrinsic base, which has a higher impedance than the base connection regions in the base semiconductor layer forming a first spacer layer on the covering layer and on the sacrificial mask;

forming a second spacer layer on the first spacer layer;

carrying out a first anisotropic etching step of the second spacer layer to form auxiliary spacers on the side walls of the first spacer layer;

carrying out a second anisotropic etching step of the first spacer layer to produce the planar spacer using the auxiliary spacers as an etching mask, wherein the first and second anisotropic etching steps are carried out in the absence of an etch mask on regions of the second spacer layer overlying the auxiliary spacers;

removing the auxiliary spacer and the sacrificial mask; and forming an emitter semiconductor layer on the surface of the semiconductor substrate and on the planar spacer.

20. The method of claim 19, wherein the auxiliary spacers, the sacrificial mask and at least one upper part of the covering layer comprise substantially the same material and are removed at substantially the same time.

* * * * *

UNITED STATES PATENT AND TRADEMARK OFFICE
CERTIFICATE OF CORRECTION

PATENT NO. : 7,709,339 B2 Page 1 of 1
APPLICATION NO. : 11/553923
DATED : May 4, 2010
INVENTOR(S) : Claus Dahl et al.

It is certified that error appears in the above-identified patent and that said Letters Patent is hereby corrected as shown below:

On the Title Page

Left column, item (30), line 1, under "Foreign Application Priority Data" replace "10 2004 021 241" with --10 2004 021 241.1--.

Signed and Sealed this

Ninth Day of November, 2010

David J. Kappos
*Director of the United States Patent and Trademark Office*